United States Patent
Consolini et al.

(10) Patent No.: US 7,256,865 B2
(45) Date of Patent: Aug. 14, 2007

(54) METHODS AND APPARATUSES FOR APPLYING WAFER-ALIGNMENT MARKS

(75) Inventors: Joseph Consolini, Costa Mesa, CA (US); Keith Best, Prunedale, CA (US); Cheng Gui, Best (NL); Alexander Friz, San Jose, CA (US)

(73) Assignee: ASML Holding N.V. (NL)

( * ) Notice: Subject to any disclaimer, the term of this patent is extended or adjusted under 35 U.S.C. 154(b) by 690 days.

(21) Appl. No.: 10/692,494

(22) Filed: Oct. 24, 2003

(65) Prior Publication Data

US 2005/0089762 A1    Apr. 28, 2005

(51) Int. Cl.
  *G03B 27/42*  (2006.01)
  *G03B 27/54*  (2006.01)
  *G01B 11/00*  (2006.01)
(52) U.S. Cl. .................... 355/53; 355/67; 356/399; 356/401
(58) Field of Classification Search .............. 355/53, 355/67; 356/399, 400, 401; 430/5, 311
   See application file for complete search history.

(56) References Cited

U.S. PATENT DOCUMENTS

| | | | |
|---|---|---|---|
| 5,094,539 A | * | 3/1992 | Komoriya et al. .......... 356/401 |
| 5,463,200 A | | 10/1995 | James et al. |
| 5,861,944 A | * | 1/1999 | Nishi ........................ 355/68 |
| 5,912,726 A | | 6/1999 | Toguchi et al. |
| 2003/0117604 A1 | | 6/2003 | Kobayashi et al. |

OTHER PUBLICATIONS

Annex to Form PCT/ISA/206, Communication Relating to the Results of the Partial International Search, Feb. 24, 2005, 3 pages.
International Preliminary Report on Patentability, Chapter 1, PCT/US2004/031627, mailed May 4, 2006.

* cited by examiner

*Primary Examiner*—Alan Matthews
(74) *Attorney, Agent, or Firm*—Blakely, Sokoloff, Taylor & Zafman LLP

(57) ABSTRACT

Embodiments of the invention provide methods and apparatuses for efficient and cost-effective imaging of alignment marks. For one embodiment, alignment mark imaging is accomplished separately from, and independent of product imaging through use of a relatively low cost, low resolution, imaging tool. For one embodiment a wafer is exposed to low-resolution light source through a reticle having a number of alignment patterns corresponding to desired alignment marks. For one embodiment, global alignment marks are imaged on a backside of a wafer. Various embodiments of the invention obviate the need for a highly accurate stage and a high-resolution imaging device, and therefore reduce processing costs and processing time.

10 Claims, 4 Drawing Sheets

METHODS AND APPARATUSES FOR APPLYING WAFER-ALIGNMENT MARKS

FIELD

Embodiments of the invention relate generally to the field of photolithography and more specifically to methods and apparatuses for aligning wafers for photolithographic imaging.

BACKGROUND

As each layer of a semiconductor device is fabricated, it is critical to product integrity that the wafer be aligned so that subsequent layers of a device are fabricated proximate, within a specified tolerance, to corresponding underlying layers. This alignment is typically effected by imaging alignment marks on the wafer.

A portion of a typical photolithographic process proceeds as follows. A wafer proceeds on a track to a photoresist application device. Liquid photoresist is applied to the wafer and excess photoresist is spun off. There is no need to align the wafer at this point as the photoresist is applied uniformly across the wafer. After application of the photoresist, the wafer is heated to harden the photoresist and then cooled for further processing. The wafer then enters a receive cassette where it is pre-aligned before proceeding to the product-imaging device (e.g., stepper or scanner). Typically the wafer has an orientation indicator, which may take the form of a notched or flattened area of the wafer to facilitate pre-alignment. A typical tolerance for pre-alignment may be approximately 8.5 microns for x-axis and y-axis orientation and 100 microradians (μrads) for rotational orientation. The pre-alignment places the wafer within a capture range for the more accurate imaging process to follow.

The pre-aligned wafer then proceeds on a stage under a product-imaging device. For example, the stepper (i.e., stepper and repeater). The stepper is an optical system that projects the reticle pattern onto the wafer to image the desired pattern. A typical stepper has a lens that can image a 22 mm×22 mm field with sub-micron resolution.

The wafer is stepped in both the x-axis and y-axis orientation to affect the imaging of an array of fields across the wafer. Each field can contain one or multiple products (e.g., transistors).

To facilitate alignment from one product layer to the next, alignment marks are imaged in each field. The alignment marks at each product layer are used to align the imaging device at the next product layer for each die. For example, a laser interferometer system may be used to reset the stage based upon the alignment marks on the previous layer. This technique is known as cascading alignment because alignment marks on each product layer are used for alignment of a subsequent product layer.

To avoid loss of die area on the wafer due to the placement of alignment marks in the product fields, the alignment marks may, instead, be placed in the scribe lines. The disadvantage with having the alignment marks in the scribe lines is that the alignment marks are difficult to maintain through the subsequent processing steps (e.g., the planarization process).

Systems with limited stage accuracy and/or limited resolution may use multiple alignment marks because the stage may not be accurate enough to align with the markings to within a desired tolerance. That is, there may be as few as one alignment mark in each field, though typically, due to limited stage accuracy, there are multiple alignment marks per field. For such systems, the average offset of multiple alignment marks may typically be used after discarding aberrational values.

Cascading alignment has the disadvantage of compounding misalignment from one product layer to the next. Moreover, die-by-die alignment is time consuming.

These disadvantages can be addressed, for systems employing more accurate stages (e.g., less than 10 nm), by employing a two-point global, zero-layer, alignment-mark imaging scheme. For such a scheme, the accuracy of the stage allows two alignment marks to define the entire wafer, which means that die-to-die alignment is unnecessary. The alignment marks are placed outside of the product field array, and therefore, do not use die area. Moreover, each product layer is aligned to the initial reference layer (zero-layer) alignment marks rather than to alignment marks on the previous product layer. Such zero-layer alignment prevents the compounding of misalignment that is possible with a cascading alignment scheme.

For two-point global, zero-layer alignment, all that is typically required is two marks, each of which is approximately 400 microns across. Typically, these marks are imaged on a wafer using the same imaging device that is used to image the product fields (i.e., a stepper or a scanner). Typically, one of the two alignment marks is imaged and then the wafer is accurately stepped to allow imaging of the other alignment mark across the wafer in the desired location within a specified tolerance. This accurate placement of the wafer is possible due to a highly accurate stage.

The typical alignment mark dimensions are such that an imaging field of 1 mm$^2$ is more than sufficient, yet the typical stepper has an image field several hundred times as large. The typical resolution required for an alignment mark is approximately 8 microns, yet typical steppers have sub-micron resolution. The use of the highly accurate stepper, or scanner, to image, which must be within the pre-align station capture range alignment marks, is highly inefficient as such imaging devices are expensive and their use adds to production costs.

BRIEF DESCRIPTION OF THE DRAWINGS

The invention may be best understood by referring to the following description and accompanying drawings that are used to illustrate embodiments of the invention. In the drawings.

DETAILED DESCRIPTION

Embodiments of the invention provide methods and apparatuses for efficient and cost-effective imaging of alignment marks. For one embodiment, alignment mark imaging is accomplished separately from, and independent of product imaging through use of a relatively low cost, low resolution, imaging tool. For one embodiment, a wafer is exposed to low-resolution light source through a reticle having a number of alignment patterns corresponding to desired alignment marks. For one embodiment, global alignment marks are imaged on a backside of a wafer. Various embodiments of the invention obviate the need for a highly accurate stage and a high-resolution imaging device, and therefore reduce processing costs and processing time.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1:
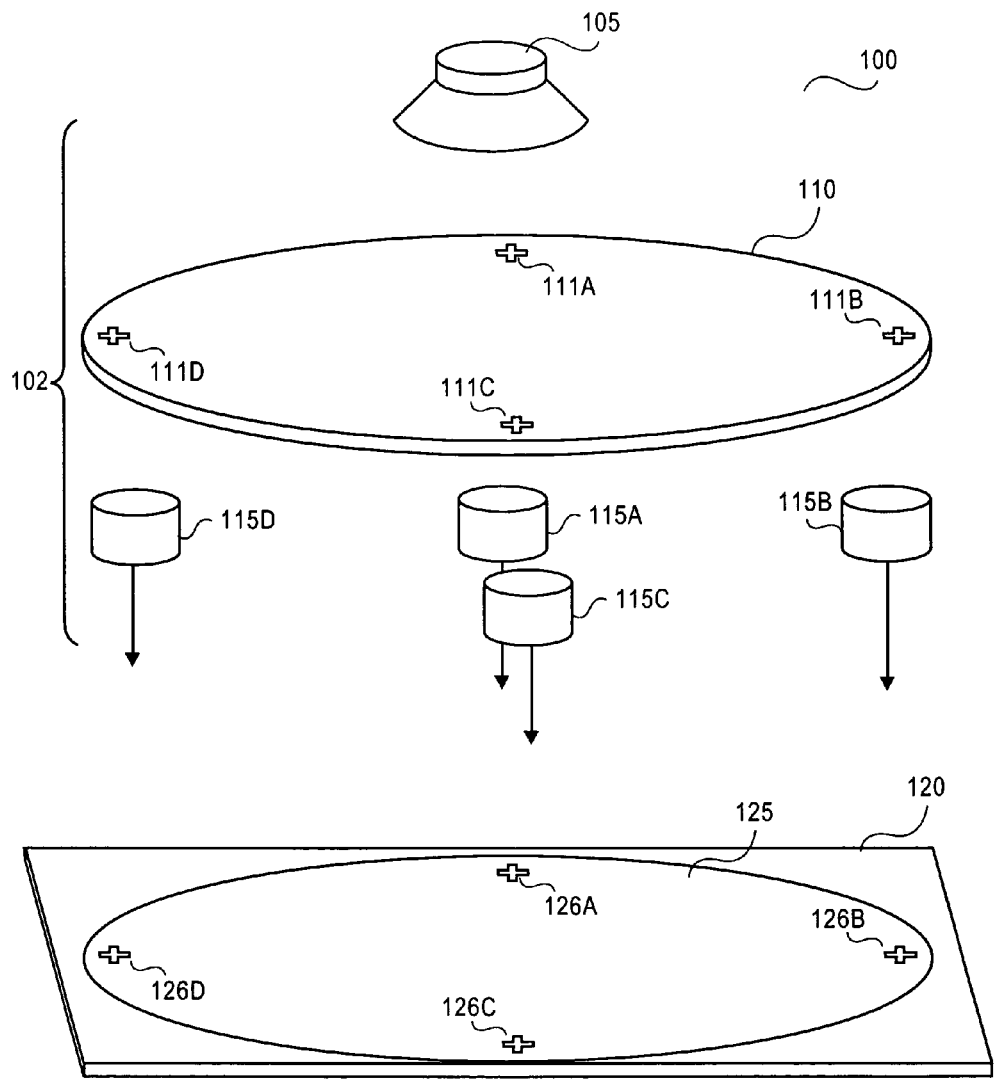
FIG. 1 illustrates an alignment mark-imaging module for imaging global, zero-layer alignment marks in accordance with one embodiment of the invention.

FIG. 1 illustrates a system employing an alignment mark-imaging module for imaging alignment marks in accordance with one embodiment of the invention. System 100, shown in FIG. 1, includes a light source 105, a reticle 110, a number of objectives 115a-115d, that make up an alignment mark imaging module 102. Alignment mark imaging module 102 may also include a stage (not shown) for supporting the reticle 110 for one embodiment of the invention. System 100 also includes a pre-alignment station 120. Wafer 125 is shown in place on pre-alignment station 120.

The pre-alignment station 120 will position the wafer 125 below objectives 115a-115d to with a desired tolerance. Upon illumination of light source 105, light will be directed through alignment mark patterns 111a-111d and objectives 115a-115d causing photoresist (not detailed) on wafer 125 to be imaged with alignment marks 126a-126d. That is, the alignment marks are imaged as the wafer is at the pre-alignment station 120. Each alignment mark may consist of one or more distinct marks.

In accordance with one embodiment of the invention, the reticle 110 has several alignment mark patterns 111a-111d. For one embodiment, the reticle may include two alignment mark patterns. For alternative embodiments, the reticle may include additional alignment mark patterns to provide alignment for multiple orientations. The alignment mark patterns 111a-111d are positioned on the reticle to within a specified tolerance. The reticle 110, therefore, is large enough to encompass the area of the wafer on which the marks will be imaged.

The alignment mark patterns are fixed on the reticle, and all of the alignment marks may be imaged upon one exposure. Therefore, there is no need to have a highly accurate track or a stepper to image an alignment mark and then step the wafer to a desired position to image a second alignment mark, as was the case in prior art schemes.

The alignment mark-imaging module 102 will be used to image the alignment marks, but will not be used to image the product field. Therefore, the objectives 115a-115d need only have an effective imaging area and resolution equal to the area and resolution of the alignment mark. Typical alignment marks have dimensions of 600 μm×600 μm or less with a resolution of approximately 8 μm.

Due to the reduced imaging area and resolution requirements for the alignment mark-imaging module 102, the light source 105 may be relatively non-uniform for one embodiment. That is, where prior art schemes required uniformity to within 1% over the entire area of the stepper lens (i.e., several hundred square mm), for one embodiment of the invention, illumination uniformity is only required over an area of approximately 1 mm$^2$ or less. Moreover, because of the reduced resolution required for alignment mark imaging, as opposed to product imaging, a lower resolution (and substantially less expensive) photoresist may be employed, which means that the illumination uniformity may be relaxed proportionately as well. For example, g-line, i-line, or broadband photoresist could be used with corresponding illumination for alternative embodiments of the invention.

Figure 2:
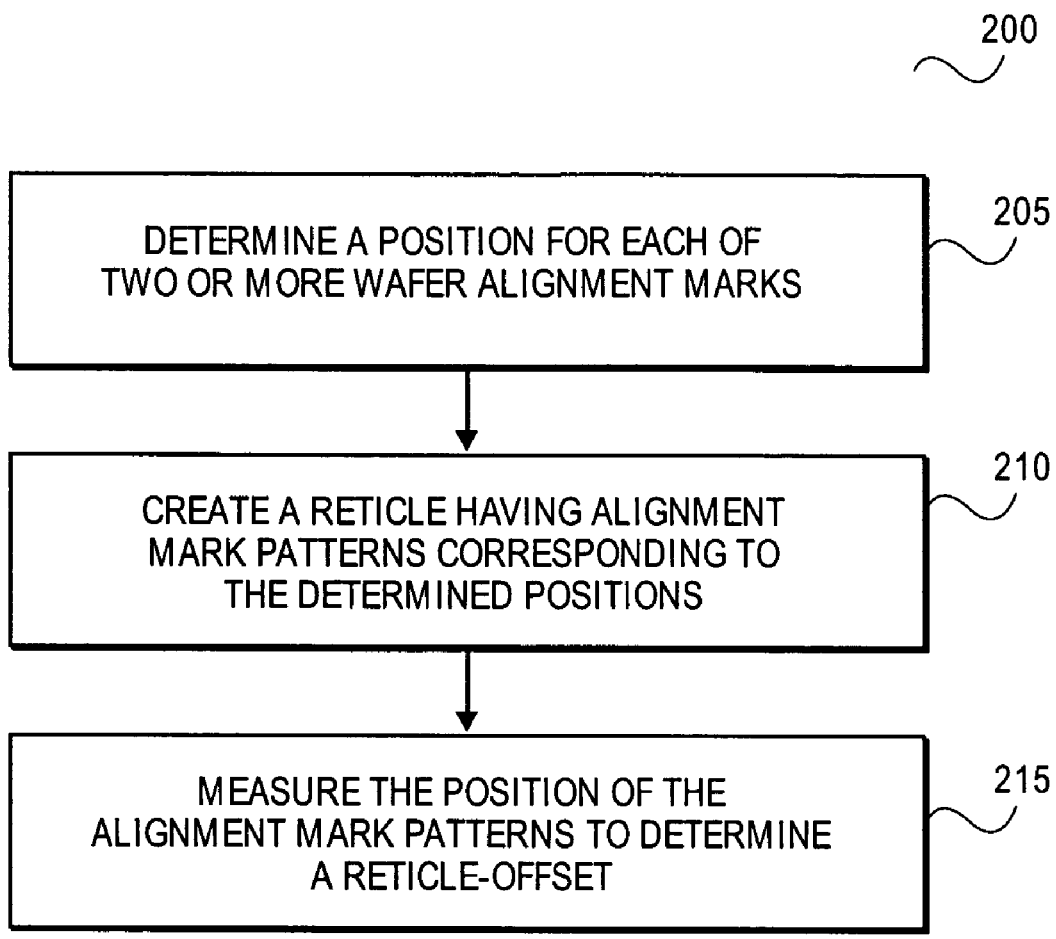
FIG. 2 illustrates a process for creating a reticle having alignment mark patterns formed thereon in accordance with one embodiment of the invention.

FIG. 2 illustrates a process for creating a reticle having alignment mark patterns formed thereon in accordance with one embodiment of the invention. Process 200, shown in FIG. 2, begins with operation 205 in which two or more wafer alignment mark positions are determined. Such positions may be determined based upon a number of criteria including product field layout.

At operation 210, alignment mark patterns are formed in the reticle at positions corresponding to the alignment mark positions determined. The alignment mark patterns may be formed by a pattern generator or other reticle-patterning device (e.g., e-beam).

At operation 215, the alignment mark patterns on the reticle are measured to determine any offset from the desired positions. That is, the reticle offset is determined to be the difference between the position of the alignment mark patterns on the reticle and the determined position of the corresponding alignment mark. A reticle offset may be caused by an error in the reticle-patterning device (e.g., an e-beam write error). The total amount of offset measured (e.g., x-axis offset, y-axis offset, and rotational offset), is used to determine magnification adjustment. For one embodiment of the invention, the alignment mark patterns are positioned with an accuracy of 5 nm of the determined position. For alternative embodiments, the alignment mark patterns are positioned with an accuracy that places them in the pre-align station capture range.

Figure 3:
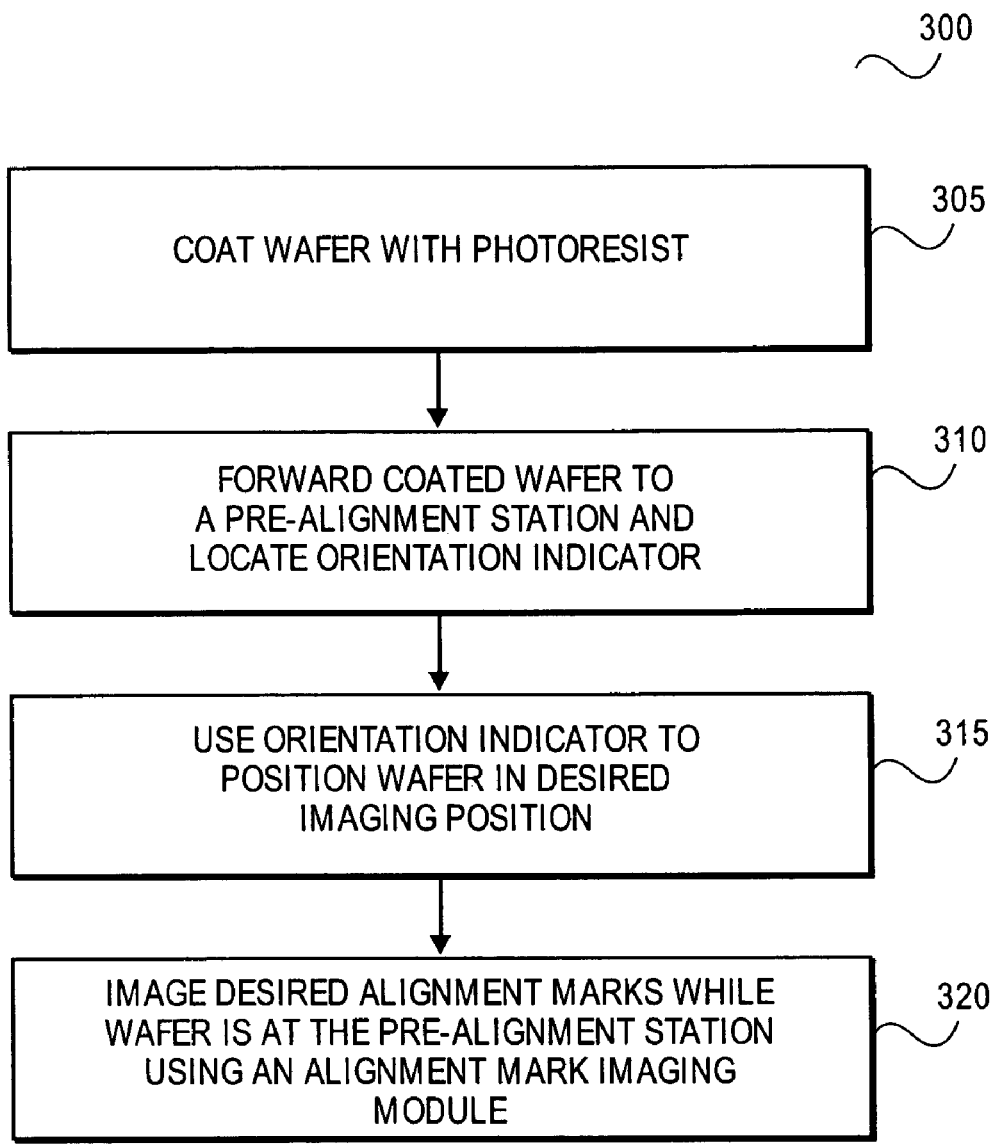
FIG. 3 illustrates a process for imaging alignment marks using an alignment mark imaging module in accordance with one embodiment of the invention.

FIG. 3 illustrates a process for imaging alignment marks using an alignment mark-imaging module in accordance with one embodiment of the invention. Process 300, shown in FIG. 3, begins with operation 305 in which photoresist is applied to a wafer in a typical manner. For various embodiments, the wafer may be a semiconductor wafer or may be any other suitable material including glass and ceramic. The photoresist is spin-coated on the wafer, and the wafer is baked and cooled, and processed in a typical photoresist application process.

At operation 310, the coated wafer is forwarded to the pre-alignment station. The pre-alignment station is located under the alignment mark-imaging module, as described above, with reference to FIG. 1. At the pre-alignment station, the wafer is rotated on the pre-alignment spindle to locate the orientation indicator (e.g., the notch or flat).

At operation 315, the orientation indicator is used to position the wafer in the desired imaging position to within a specified tolerance. For one embodiment, the pre-alignment station uses the orientation indicator to position the wafer to within approximately 44 μm of the desired imaging position.

At operation 320, the alignment marks are imaged on the wafer by the alignment mark-imaging module. In accordance with one embodiment, the alignment marks are imaged on the wafer while the wafer is at the pre-alignment station.

Back Side Alignment

An alignment mark-imaging module, in accordance with alternative embodiments of the invention, may be used to image global, zero-layer alignment marks on the front side (product field side) of the wafer. There are several disadvantages to front side alignment (FSA), that is, imaging global, zero-layer alignment marks on the front side of the wafer. With FSA it is difficult to commit to fixed locations for the global, zero-layer alignment marks because each device manufacturer wishes to accommodate as many product fields per wafer as possible. Therefore, device manufacturers often have different product field layouts to maximize wafer use for their particular device dimensions. Accommodating these various layouts would require repositioning of the alignment mark imaging objectives. Additionally, front side global, zero-layer alignment requires alignment to the marks after each product layer is imaged. This means continually having to align through increasing numbers of process levels and product layers.

A backside alignment (BSA) scheme consists of imaging the wafer alignment marks on one side of a double-sided polished wafer and imaging the product layers on the opposite side. With such a scheme, the alignment marks are in a standard position corresponding to windows on the chuck. BSA is possible with a stage that is accurate enough to correlate alignment on the frontside with alignment on the backside. With BSA, the entire frontside of the wafer may be used for product fields. Also, because alignment is not taking place through multiple product layers, alignment is easier and more effective.

Figure 4:
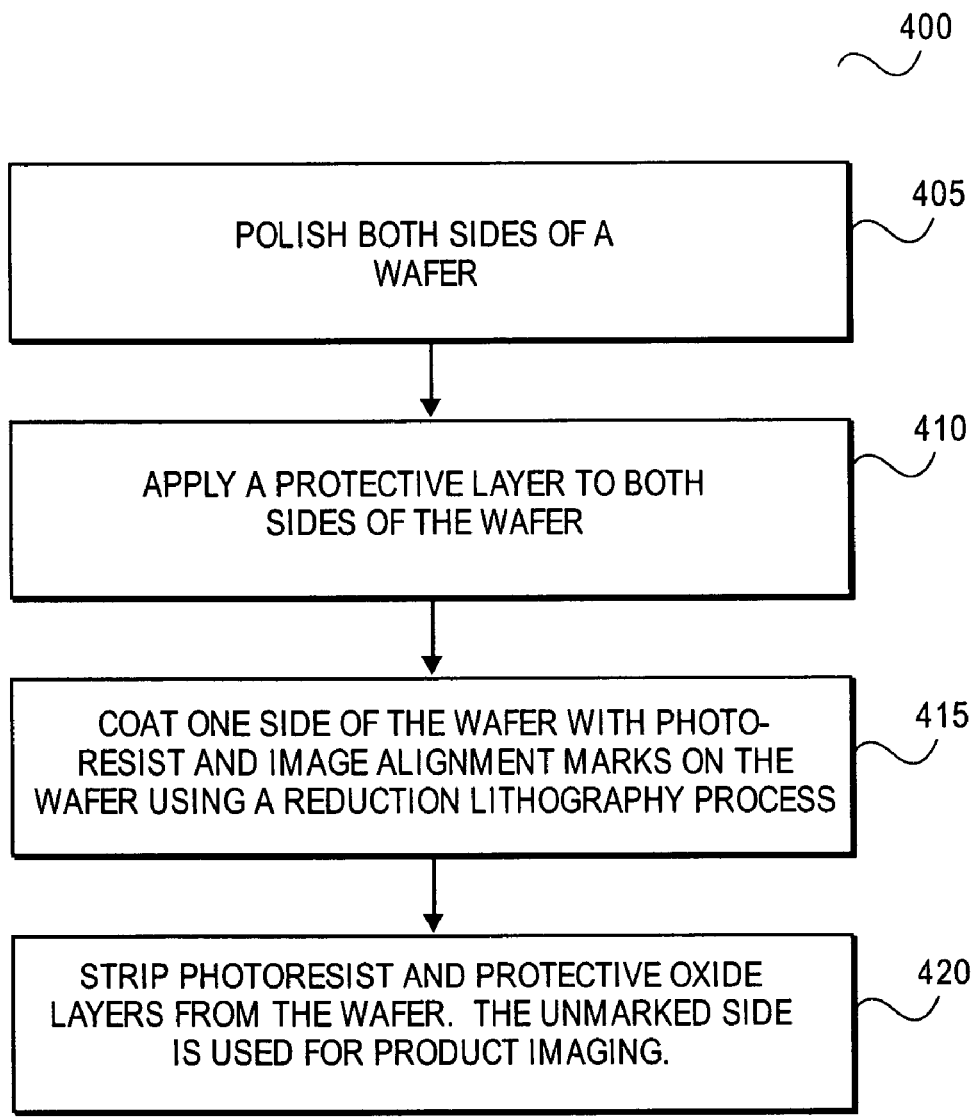
FIG. 4 illustrates a process for imaging alignment marks on the backside of a wafer to affect BSA for a reduction lithography process in accordance with one embodiment of the invention.

FIG. 4 illustrates a process for imaging alignment marks on the backside of a wafer to affect BSA for a reduction lithography process in accordance with one embodiment of the invention. Process 400, shown in FIG. 4, begins at operation 405 in which a wafer is polished on both sides.

At operation 410, a protective layer is applied to both sides of the wafer to protect the wafer during subsequent processing. For example, both sides of the wafer may be coated with a protective oxide.

At operation 415, the wafer is coated on one side with photoresist, and the alignment marks are imaged on the wafer using a reduction lithography process. The alignment mark imaging may be accomplished using an alignment mark imaging module, as described in reference to FIG. 1, or alternatively, using an imaging device in accordance with the prior art. The photoresist is developed and etched subsequent to imaging the alignment marks.

At operation 420, the photoresist is stripped from the wafer along with the protective oxide layers. The side of the wafer with the imaged alignment marks is then considered the backside of the wafer. The opposite side is considered the front side of the wafer and is used for product imaging. Thus, alignment marks have been effectively imaged on the backside for BSA.

General Matters

Embodiments of the invention provide an alignment mark imaging module that uses a reticle having two or more alignment mark patterns and a set of relatively low-resolution objectives to replace the accurate stage and imaging device of prior art schemes. For one embodiment, the objective has an effecting imaging area of approximately 1 mm². For one embodiment, a low-resolution photoresist is used to image the alignment marks. For such an embodiment, a relatively non-uniform light source may be used.

While embodiments of the invention have been described in reference to FIGS. 1 through 4 above, many alternative embodiments are possible, as will be appreciated by those skilled in the art.

For example, the light source 105 described in reference to FIG. 1, may for one embodiment, be replaced by individual light sources corresponding to each objective. For such an embodiment, the light from each individual light source may be transmitted to the objective via an optic fiber or a light pipe. Such an embodiment would allow imaging of selected alignment marks by illuminating only the desired corresponding light sources.

For one embodiment, the reticle 110 and objectives 115a-115d, described in reference to FIG. 1, may be replaced by a proximity mask. The mask, which for one embodiment could be a quartz plate, may be suspended above the wafer close enough to image the alignment mark. For another alternative embodiment, a contact mask could be used. For still another alternative embodiment, a reticle for each alignment mark may be used with each reticle mounted to a common stage.

For one embodiment, the imaging of alignment marks is accomplished while the wafer is at the pre-alignment station as described in reference to FIG. 3. For such an embodiment, a verification mechanism may be employed to ensure the pre-alignment has positioned the wafer in the desired position within a specified tolerance. For one embodiment, a pre-alignment station feedback loop may be implemented to provide redundant position verification.

In reference to FIG. 4, a process for imaging alignment marks on the backside of a wafer to affect BSA for a reduction lithography process is described in which both sides of the wafer are initially polished. In an alternative embodiment, the wafer is initially polished on only one side. The polished side is coated with oxide for protection. The wafer is then coated with photoresist and alignment marks are imaged on the wafer. The photoresist is then developed and etched; the oxide coating left on the polished side. Subsequently, the unpolished side of the wafer is polished and is used as the front side (i.e., for product imaging).

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a reticle unit having formed thereon two or more alignment mark patterns corresponding to a desired alignment mark;
   a light source capable transmitting light through the alignment mark patterns of the reticle; and
   two or more objectives each objective positioned to receive light transmitted through one of the alignment mark patterns, each objective having an effective imaging area approximately equal to the area of the desired alignment mark.

2. The apparatus of claim 1 wherein the reticle unit is a single reticle.

3. The apparatus of claim 2 wherein the effective imaging area of each objective is less than 1 mm².

4. The apparatus of claim 3 wherein the light source is a broadband light source.

5. The apparatus of claim 2 wherein the light source includes a plurality of distinct light sources each corresponding to one of the objectives.

6. The apparatus of claim 1 wherein the alignment mark patterns are positioned on the reticle unit within 5 nm of a desired position.

7. The apparatus of claim 5 wherein light from each of the distinct light sources is transmitted to a corresponding objective via an optic fiber.

8. The apparatus of claim 2 wherein the reticle is a quartz wafer.

9. The apparatus of claim 2 wherein the light source has a uniformity based upon a resolution required to image the desired alignment mark.

10. The apparatus of claim 9 wherein the resolution required to image the desired alignment mark is approximately 8 μm.

* * * * *